(12) United States Patent
Hirobe et al.

(10) Patent No.: US 7,865,323 B2
(45) Date of Patent: Jan. 4, 2011

(54) CALIBRATION PROGRAM AND ELECTRONIC COMPASS

(75) Inventors: Kisei Hirobe, Miyagi-ken (JP); Yukimitsu Yamada, Miyagi-ken (JP); Katsuyuki Kawarada, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 19 days.

(21) Appl. No.: 12/267,454

(22) Filed: Nov. 7, 2008

(65) Prior Publication Data
US 2009/0070057 A1 Mar. 12, 2009

Related U.S. Application Data

(63) Continuation of application No. PCT/JP2007/059354, filed on May 2, 2007.

(30) Foreign Application Priority Data

May 9, 2006 (JP) ............................. 2006-130069
Apr. 26, 2007 (JP) ............................. 2007-117419

(51) Int. Cl.
*G01C 17/38* (2006.01)
(52) U.S. Cl. ...................................................... 702/92
(58) Field of Classification Search .................. 702/92, 702/94, 95, 97, 104, 150–153, 155, 158; 33/319, 320, 326, 356, 357; 73/1.01, 1.75, 73/1.76, 1.79, 1.81
See application file for complete search history.

(56) References Cited

U.S. PATENT DOCUMENTS 4,807,462 A * 2/1989 Al-Attar .................... 73/1.76
6,301,794 B1 * 10/2001 Parks et al. ................ 33/356
6,760,678 B1 * 7/2004 Hon et al. .................. 702/92
7,177,779 B2 2/2007 Hikida et al.

(Continued)

FOREIGN PATENT DOCUMENTS

JP 2005-265414 9/2005

(Continued)

OTHER PUBLICATIONS

Notification of Reasons for Refusal dated May 12, 2009 for Japanese Patent Application No. 2008-514472.

(Continued)

*Primary Examiner*—Michael P Nghiem
*Assistant Examiner*—Cindy H Khuu
(74) *Attorney, Agent, or Firm*—Beyer Law Group LLP

(57) ABSTRACT

The object of the present invention is to provide a calibration program and an electronic compass that make it possible to calibrate the output of a magnetic sensor with a small amount of computation while a user does not notice the execution of calibration. A calibration program according to an aspect of the invention includes: a step of forming at least two triangles 21 and 22 with the use of at least four outputs of a magnetic sensor in a three-dimensional space; a step of finding circles 23 and 24 circumscribed about the triangle 21 and 22, respectively; and a step of finding the intersection of normal vectors 25 and 26 each of which passes through the center of the corresponding circumscribed circle so as to find a reference point.

9 Claims, 5 Drawing Sheets

U.S. PATENT DOCUMENTS

| | | | |
|---|---|---|---|
| 7,363,718 B2 * | 4/2008 | Sato et al. ...................... 33/356 |
| 7,418,359 B2 * | 8/2008 | Handa ........................ 702/104 |
| 7,532,991 B2 * | 5/2009 | Handa ........................ 702/92 |
| 7,542,869 B2 * | 6/2009 | Gandelsman et al. ....... 702/152 |
| 7,676,341 B2 * | 3/2010 | Handa ........................ 702/104 |
| 2003/0167121 A1 * | 9/2003 | Ockerse et al. .............. 701/224 |
| 2004/0254727 A1 * | 12/2004 | Ockerse et al. .............. 701/224 |
| 2005/0256673 A1 * | 11/2005 | Hikida et al. ............... 702/150 |
| 2005/0278137 A1 * | 12/2005 | Hammerschmidt et al. . 702/151 |
| 2006/0066295 A1 * | 3/2006 | Tamura et al. .............. 324/202 |
| 2006/0190174 A1 * | 8/2006 | Li et al. ...................... 701/224 |
| 2007/0124076 A1 * | 5/2007 | Ockerse et al. .............. 701/224 |
| 2007/0198209 A1 * | 8/2007 | Sato ........................... 702/155 |
| 2007/0288166 A1 * | 12/2007 | Ockerse et al. .............. 701/224 |
| 2007/0295089 A1 * | 12/2007 | Velinsky et al. .......... 73/514.01 |
| 2008/0289203 A1 * | 11/2008 | Martikka et al. .............. 33/356 |
| 2010/0063763 A1 * | 3/2010 | Rozelle ....................... 702/92 |

FOREIGN PATENT DOCUMENTS

JP    2006-053081    2/2006

OTHER PUBLICATIONS

Notification of Reasons for Refusal dated Dec. 8, 2009 for Japanese Patent Application No. 2008-514472.

\* cited by examiner

FIG. 1
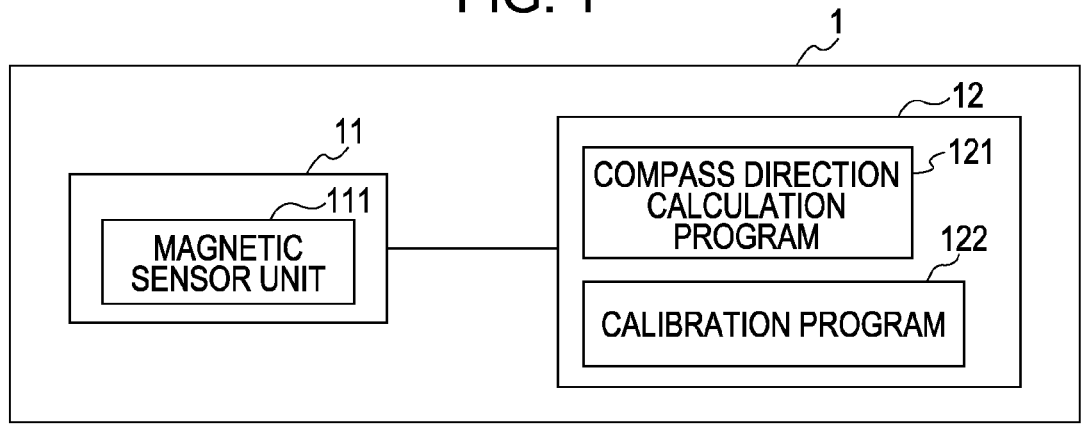
FIG. 2
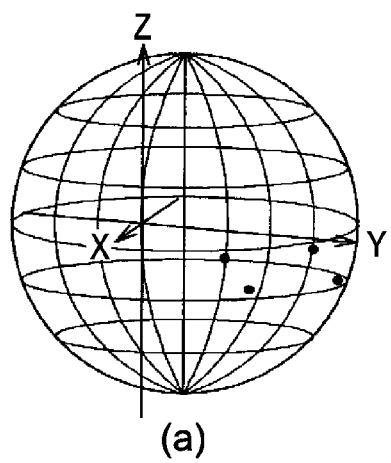
(a)
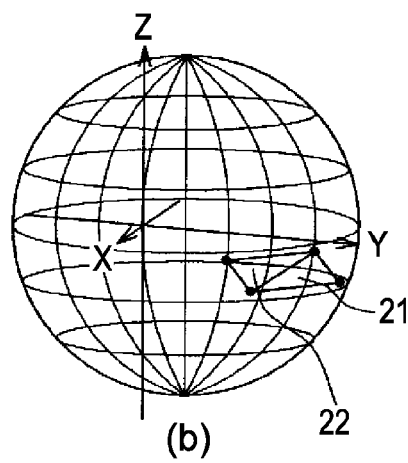
(b)
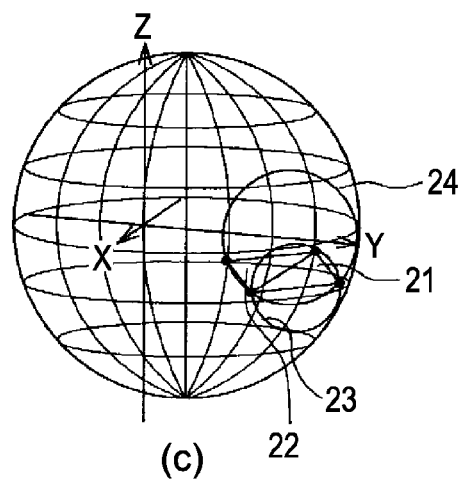
(c)
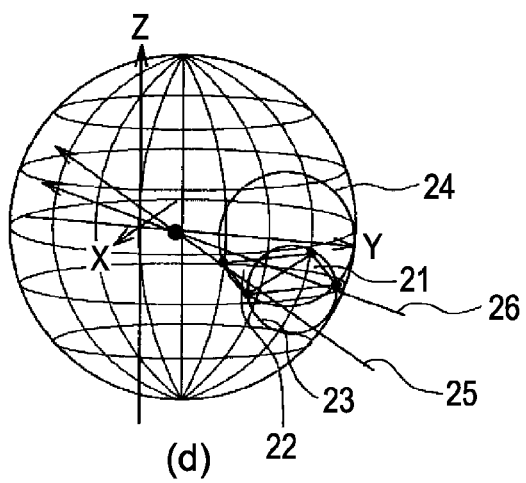
(d)

| BUFFER 1 | | | BUFFER 2 | | | BUFFER 3 | | | BUFFER 4 | | | BUFFER 5 | | |
|---|---|---|---|---|---|---|---|---|---|---|---|---|---|---|
| $P_{A1}$ | | | $P_{A2}$ | | | $P_{A3}$ | | | $P_{A4}$ | | | $P_{A5}$ | | |

(b)

| BUFFER 1 | | | BUFFER 2 | | | BUFFER 3 | | | BUFFER 4 | | | BUFFER 5 | | |
|---|---|---|---|---|---|---|---|---|---|---|---|---|---|---|
| $P_{A1}$ | $P_{B1}$ | | $P_{A2}$ | | | $P_{A3}$ | | | $P_{A4}$ | | | $P_{A5}$ | | |

(c)

| BUFFER 1 | | | BUFFER 2 | | | BUFFER 3 | | | BUFFER 4 | | | BUFFER 5 | | |
|---|---|---|---|---|---|---|---|---|---|---|---|---|---|---|
| $P_{A1}$ | $P_{B1}$ | $P_{C1}$ | $P_{A2}$ | $P_{B2}$ | $P_{C2}$ | $P_{A3}$ | $P_{B3}$ | $P_{C3}$ | $P_{A4}$ | $P_{B4}$ | $P_{C4}$ | $P_{A5}$ | $P_{B5}$ | $P_{C5}$ |

(d)

| BUFFER 1 | | | | BUFFER 2 | | | | BUFFER 3 | | | | BUFFER 4 | | | | BUFFER 5 | | | |
|---|---|---|---|---|---|---|---|---|---|---|---|---|---|---|---|---|---|---|---|
| $P_{A1}$ | $P_{B1}$ | $P_{C1}$ | $P_{D1}$ | $P_{A2}$ | $P_{B2}$ | $P_{C2}$ | $P_{D2}$ | $P_{A3}$ | $P_{B3}$ | $P_{C3}$ | $P_{D3}$ | $P_{A4}$ | $P_{B4}$ | $P_{C4}$ | $P_{D4}$ | $P_{A5}$ | $P_{B5}$ | $P_{C5}$ | $P_{D5}$ |

FIG. 9

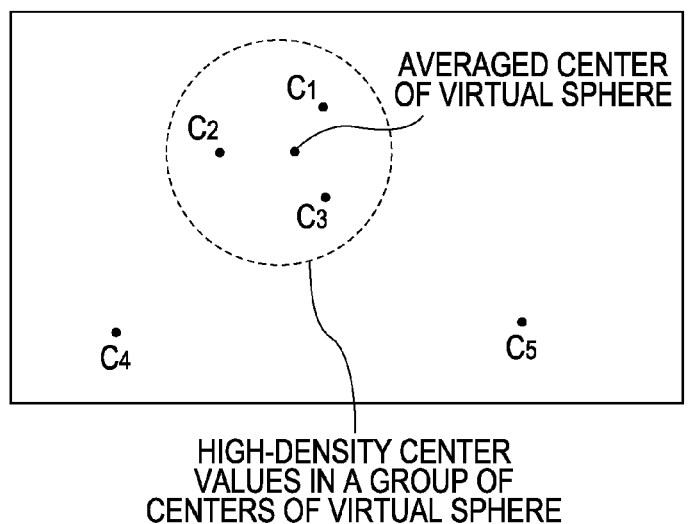

US 7,865,323 B2

CALIBRATION PROGRAM AND ELECTRONIC COMPASS

CLAIM OF PRIORITY

This application is a continuation of International Application No. PCT/JP2007/059354, filed May 2, 2007, which claims benefit of Japanese Patent Application No. 2006-130069 filed on May 9, 2006 and Japanese Patent Application No. 2007-117419 filed on Apr. 26, 2007, all of which are hereby incorporated by reference.

BACKGROUND OF THE INVENTION

1. Field of the Invention

The present invention relates to a calibration program for calibrating the output of a magnetic sensor, which detects terrestrial magnetism. In addition, the invention further relates to an electronic compass that is provided with such a calibration program.

2. Description of the Related Art

An electronic compass is a device that calculates a directional angle with respect to a reference direction with the use of the output of a magnetic sensor. Since an electronic compass is mounted on a handheld terminal device such as a mobile phone or the like, it might not be possible, in some cases, to calculate a compass bearing accurately due to the adverse effects of magnetized peripheral parts that are mounted in the handheld terminal device. That is, although an electronic compass is capable of calculating a compass direction accurately when the output of its magnetic sensor contains components corresponding to earth magnetism only, it is not possible to obtain an accurate output corresponding to the amount of terrestrial magnetism due to an offset added to the output of the magnetic sensor if the peripheral parts of the magnetic sensor are magnetized.

As a method for correcting the offset of a magnetic-sensor output, there is an offset correction method according to which a device on which an electronic compass is mounted is turned in each of the X-axis direction, the Y-axis direction, and the Z-axis direction; and then, an average of the maximum output values and the minimum output values is calculated so as to perform offset correction (Patent Document 1).

Patent Document 1: Japanese Unexamined Patent Application Publication No. 2005-265414 (Prior Art).

SUMMARY OF THE INVENTION

However, according to the conventional offset correction method, since the maximum output value and the minimum output value for each of the X, Y, and Z axes are calculated on the basis of many plots that are obtained when the device is turned in each of the X-axis direction, the Y-axis direction, and the Z-axis direction, the amount of computation is substantially large. Therefore, there is a problem in that a heavy processing burden is placed on a CPU. Moreover, there is another problem in that it cannot avoid burdensome manipulation for offset correction because it is necessary for a user to turn their device in each of the X-axis direction, the Y-axis direction, and the Z-axis direction.

The object of the present invention is to provide a calibration program and an electronic compass that make it possible to calibrate the output of a magnetic sensor with a small amount of computation while a user does not notice the execution of calibration.

A calibration program according to an aspect of the present invention is a program that can be executed by a computer for finding a reference point for the output of a magnetic sensor. The calibration program includes: a step of forming at least two triangles with the use of at least four outputs of the magnetic sensor in a three-dimensional space; a step of finding, for each of the above-mentioned at least two triangles, a circle circumscribed about the triangle; and a step of finding the intersection of normal vectors each of which passes through the center of the corresponding circumscribed circle so as to find the reference point.

With such a calibration program according to an aspect of the invention, it is possible to find the reference point for the output of a magnetic sensor (i.e., the origin of a geomagnetic vector) and perform offset correction with a small amount of computation. In addition, it is possible to obtain detection data, which is used for finding the reference point, just by tilting a device on which the compass module 11 is mounted by approximately ±30°. Therefore, it is possible to calibrate the output of a magnetic sensor while a user does not notice the execution of calibration.

In a calibration program according to an aspect of the present invention, it is preferable that the above-mentioned at least four outputs should be obtained so as to satisfy two conditions: a first condition is that each distance between the point of one output and the point of another output is not smaller than a predetermined distance value; and a second condition is that a planed angle or each planed angle that is formed by the above-mentioned at least two triangles does not exceed a predetermined angle tolerance ($\Delta\theta$), the center of which is 90°.

In a calibration program according to an aspect of the present invention, it is preferable that the reference point should be found by acquiring a plurality of sets of the above-mentioned at least four outputs and then by finding an average of a group of centers of the virtual sphere, each center being found on the basis of the corresponding set of the above-mentioned at least four outputs. In such a preferred calibration program, it is further preferable that the above-mentioned at least four outputs should be obtained so as to satisfy three conditions: a first condition is that each distance between the point of one output and the point of another output is not smaller than a predetermined distance value; a second condition is that the distance between the found center of the virtual sphere and each of the above-mentioned at least four outputs is not larger than a predetermined distance value; and a third condition is that a planed angle or each planed angle that is formed by the above-mentioned at least two triangles does not exceed a predetermined angle tolerance ($\Delta\theta$), the center of which is 90°.

An electronic compass according to an aspect of the present invention includes: a compass module that is provided with a magnetic sensor; and a controlling section that is provided with the calibration program described above, which finds a reference point for the output of the magnetic sensor with the use of the output of the magnetic sensor, and is further provided with a compass direction calculation program, which finds a compass direction with the use of the output of the magnetic sensor.

With such a configuration, it is possible to find the reference point for the output of a magnetic sensor (i.e., the origin of a geomagnetic vector) and perform offset correction with a small amount of computation. In addition, it is possible to obtain detection data, which is used for finding the reference point, just by tilting a device on which the compass module 11 is mounted by approximately ±30°. Therefore, it is possible to calibrate the output of a magnetic sensor and find a compass direction while a user does not notice the execution of calibration.

In the configuration of an electronic compass according to an aspect of the present invention, it is preferable that the controlling section should be further provided with a plurality of buffers each of which can store the above-mentioned at least four outputs; and the controlling section should judge whether it is possible to store the output of the magnetic sensor into the plurality of buffers or not on the basis of predetermined judgment conditions.

In the configuration of an electronic compass according to an aspect of the present invention, it is preferable that the controlling section should automatically run the calibration program in response to the occurrence of a change in the ambient conditions of the magnetic sensor.

BRIEF DESCRIPTION OF THE DRAWINGS

FIG. 1 is a block diagram that schematically illustrates an example of the configuration of an electronic compass according to an exemplary embodiment of the present invention;

FIGS. 2(a)-(d) are a set of diagrams for explaining the principle of calibration according to an exemplary embodiment of the present invention;

FIGS. 8(a)-(d) is a set of diagrams that schematically illustrates the storage status of buffers in the process of four-point acquisition for the plurality of sets;

FIG. 9 is a diagram for explaining relative density in the process of averaging a plurality of centers of a virtual sphere.

DESCRIPTION OF THE PREFERRED EMBODIMENTS

Figure 3:
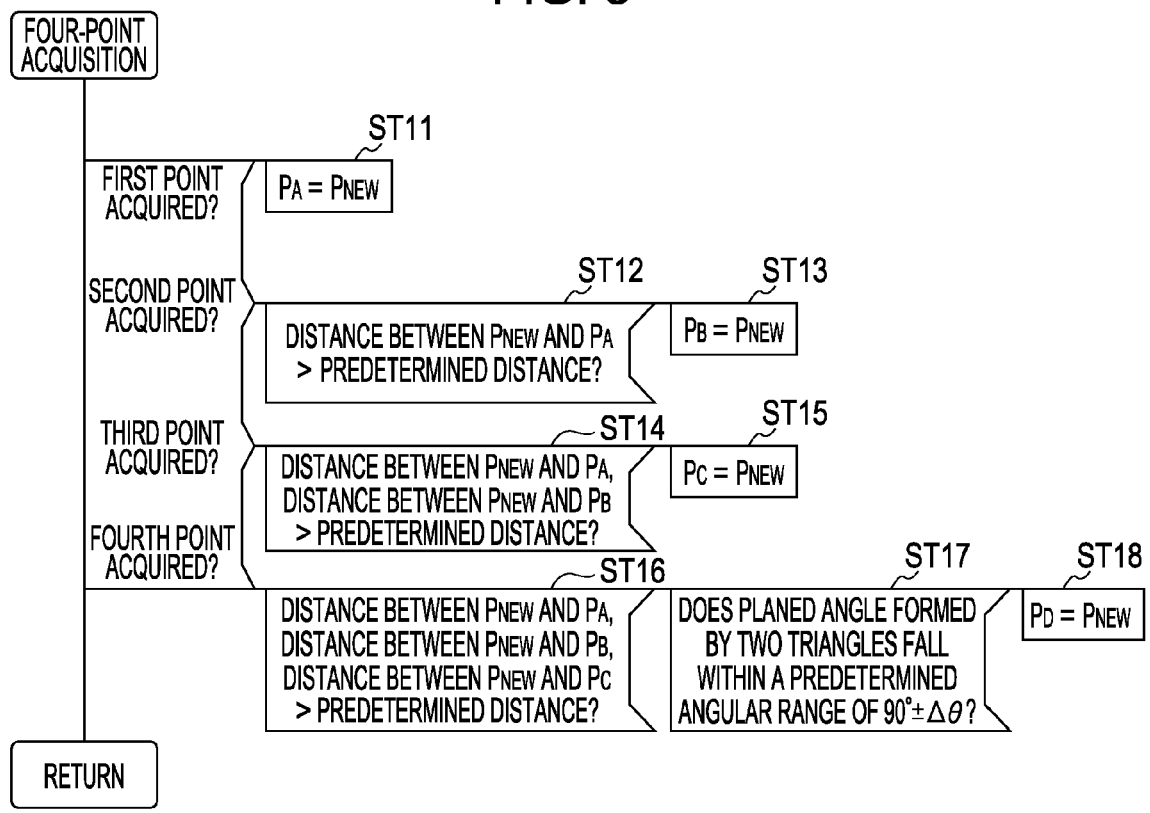
FIG. 3 is a flowchart that illustrates the procedure of sensor-output data acquisition that is performed so as to determine four points.

With reference to the accompanying drawings, an exemplary embodiment of the present invention is explained in detail below.

FIG. 1 is a block diagram that schematically illustrates an example of the configuration of an electronic compass according to an exemplary embodiment of the present invention. An electronic compass 1 shown in FIG. 1 is mainly made up of a compass module 11 and a controlling unit 12. The compass module 11 is provided with a magnetic sensor unit 111. The controlling unit 12 is provided with a compass direction calculation program 121 and a calibration program 122. The compass direction calculation program 121 calculates a compass bearing with the use of an output of the magnetic sensor unit 111. The calibration program 122 calculates a reference point for the output of a magnetic sensor with the use of the output of the magnetic sensor unit 111. In addition thereto, the controlling unit 12 is further provided with a plurality of buffers that can store at least four outputs.

A magnetic sensor that is capable of performing magnetic detection for at least three axes is used in the magnetic sensor unit 111 of the compass module 11. The type of a sensor element that constitutes such a magnetic sensor is not specifically limited herein. For example, a magneto-resistive element such as a GMR (Giant Magneto Resistance) element, an AMR (Anisotropic Magneto Resistance) element, or a TMR (Tunnel Magneto Resistance) element may be used as a sensor element. Or, a hall element may be used as a sensor element. In addition to the magnetic sensor unit 111, the compass module 11 is provided with a processing unit that applies a voltage and a magnetic field to the magnetic sensor unit 111 and is further provided with another processing unit that converts an analog signal into a digital signal, without any limitation thereto.

The controlling unit 12 has at least the compass direction calculation program 121 and the calibration program 122 as driver software, which drives the compass module 11. As long as the compass direction calculation program 121 enables a directional angle with respect to a reference direction to be calculated on the basis of magnetic detection information sent from the compass module 11, its specific method of calculation is not limited herein.

The calibration program 122 is a program that finds a reference point for the output of a magnetic sensor. If there exists any magnetized component in the neighborhood of a device on which a compass module is mounted, an offset is added to the output of the magnetic sensor unit 111, which makes it impossible to obtain accurate magnetic detection information. That is, under such a condition, the relation of a geomagnetic vector to a magnetic sensor output is unknown. Accordingly, a reference point for the output of a magnetic sensor (i.e., the origin of a geomagnetic vector) is found by means of the calibration program 122 (offset correction).

The calibration program 122 is a program that can be executed by a computer for finding a reference point for the output of a magnetic sensor. The calibration program 122 includes: a step of forming at least two triangles with the use of at least four outputs of the magnetic sensor in a three-dimensional space; a step of finding, for each of the above-mentioned at least two triangles, a circle circumscribed about the triangle; and a step of finding the intersection of normal vectors each of which passes through the center of the corresponding circumscribed circle so as to find the reference point.

FIGS. 2(a)-(d) are a set of diagrams for explaining the principle of calibration according to an exemplary embodiment of the present invention. A virtual sphere shown in FIG. 2 has its center at a reference point for the output of a magnetic sensor, which is a solution to be found herein. A distance between the intersection of the X axis, the Y axis, and the Z axis shown inside the virtual sphere and the center of the virtual sphere corresponds to an offset. Therefore, the reference point for the output of a magnetic sensor (i.e., the origin of a geomagnetic vector) is found in an offset-added state through the following steps.

In a first step, the outputs of the magnetic sensor are obtained in a three-dimensional space as shown in FIG. 2(a). The magnetic sensor output is obtained as data that is detected by the magnetic sensor unit 111, that is, as detection data when a user moves a device in which the compass module 11 is built. As such detection data, sensor-output data has to be acquired so as to determine at least four points in order to form two triangles on the basis thereof. A more detailed explanation thereof will be given later. Then, as shown in FIG. 2(b), two triangles 21 and 22 are drawn with the use of the above-mentioned at least four-point detection data, which was acquired in this first step. Note that it is possible to obtain detection data just by tilting the device on which the compass module 11 is mounted by approximately ±30°.

In a second step, circumscribed circles 23 and 24 of the triangles 21 and 22 are found respectively as shown in FIG. 2(c). In FIG. 2(c), the circle 23 is circumscribed about the triangle 21, whereas the circle 24 is circumscribed about the triangle 22. The reason why these circumscribed circles 23 and 24 are found is to obtain the cut sections of the virtual sphere mentioned above.

In a third step, as shown in FIG. 2(d), the intersection of normal vectors 25 and 26 drawn through the respective centers of the circumscribed circles 23 and 24 is found as the reference point. The vector 25 is normal to the circumscribed circle 23, whereas the vector 26 is normal to the circumscribed circle 24. As has already been described above, each of the circumscribed circles 23 and 24 forms a cut surface of the virtual sphere. Each of the normal vectors 25 and 26 is a line perpendicular to the corresponding cut surface. Accordingly, each of the normal vectors 25 and 26 passes through the center of the virtual sphere. Thus, the found intersection of the normal vectors 25 and 26 is the center of the virtual sphere. In this way, the reference point for a magnetic-sensor output (i.e., the origin of a geomagnetic vector) is found as the center of the virtual sphere.

As described above, a calibration program according to the present embodiment of the invention makes it possible to find the reference point for the output of a magnetic sensor (i.e., the origin of a geomagnetic vector) and perform offset correction with a small amount of computation. In addition, it is possible to obtain detection data, which is used for finding the reference point, just by tilting a device on which the compass module 11 according to the present embodiment of the invention is mounted by approximately ±30°. Therefore, it is possible to calibrate the output of a magnetic sensor while a user does not notice the execution of calibration.

It is anticipated that the sensor output of an electronic compass having a calibration program according to the present embodiment of the invention might vary depending on the ambient conditions of a compass module such as a temperature change or the like. It is preferable that an electronic compass should be configured to automatically calibrate such sensor-output variation due to a change in the ambient conditions thereof whenever it occurs. For such automatic calibration, the electronic compass according to the present embodiment of the invention monitors the radius of the virtual sphere (i.e., the magnitude of a geomagnetic vector) that is found by the above-mentioned calibration program so as to detect a geomagnetic-vector change. Upon the detection of a geomagnetic-vector change, the electronic compass runs the calibration program. For example, a judgment is made as to whether a change in the magnitude of a geomagnetic vector is greater than a threshold value of, for example, 10%, 20%, 30% or the like or not. Then, if it is judged that the change in the magnitude thereof is greater than the threshold value, the calibration program is launched. With such a setting configuration, it is possible to automatically calibrate the output of a magnetic sensor while a user does not notice the execution of calibration. Thus, the electronic compass can always calculate a compass direction accurately.

The calibration program according to the present embodiment of the invention acquires sensor-output data so as to determine at least four points in order to form two triangles. When sensor-output data is acquired so as to determine the above-mentioned at least four points, the following two conditions should be satisfied. That is, a first condition that should be taken into consideration is that each distance between the point of one output and the point of another output is not smaller than a predetermined point-to-point distance value. A second condition that should be taken into consideration is that a planed angle or each planed angle that is formed by the above-mentioned at least two triangles does not exceed a predetermined angle tolerance ($\Delta\theta$), the center of which is 90°.

Figure 4:
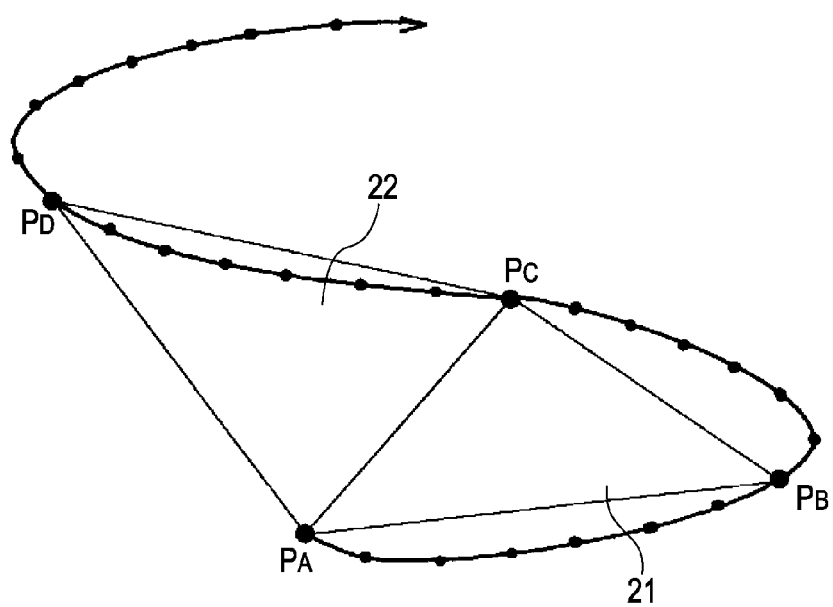
FIG. 4 is a schematic diagram that illustrates the concept of sensor-output data acquisition performed so as to determine four points, the procedure of which is shown in FIG. 3.

FIG. 3 is a flowchart that illustrates the procedure of sensor-output data acquisition that is performed so as to determine four points. FIG. 4 is a schematic diagram that illustrates the concept of sensor-output data acquisition performed so as to determine four points, the procedure of which is shown in FIG. 3. In each of FIGS. 3 and 4, an arbitrary sensor output value is denoted as $P_{NEW}$. In addition, sensor output values to be detected for four points are denoted as $P_A$, $P_B$, $P_C$, and $P_D$. As shown in FIG. 3, as a first step, sensor-output data is acquired so as to determine a first point. The sensor output value $P_{NEW}$ that is detected thereat is set as $P_A$ (ST 11). Next, sensor-output data is acquired so as to determine a second point; for the determination of the second point, it is judged whether the point-to-point distance between the sensor output value $P_{NEW}$ that is detected thereat and the first-point sensor output value $P_A$ is not smaller than a predetermined distance value or not (ST 12). If it is judged that the point-to-point distance between the sensor output value $P_{NEW}$ that is detected thereat and the first-point sensor output value $P_A$ is not smaller than the predetermined distance value, the detected sensor output value $P_{NEW}$ is set as $P_B$ (ST 13).

Next, sensor-output data is acquired so as to determine a third point; for the determination of the third point, a judgment is made as to whether each of two point-to-point distances, that is, the distance between the sensor output value $P_{NEW}$ that is detected thereat and the first-point sensor output value $P_A$ as well as the distance between the sensor output value $P_{NEW}$ that is detected thereat and the second-point sensor output value $P_B$, is not smaller than the predetermined distance value or not (ST 14). If it is judged that the point-to-point distance between the sensor output value $P_{NEW}$ detected thereat and the first-point sensor output value $P_A$ is not smaller than the predetermined distance value, and further if it is judged that the point-to-point distance between the sensor output value $P_{NEW}$ detected thereat and the second-point sensor output value $P_B$ is also not smaller than the predetermined distance value, the detected sensor output value $P_{NEW}$ is set as $P_C$ (ST 15). Thereafter, sensor-output data is acquired so as to determine a fourth point; for the determination of the fourth point, a judgment is made as to whether each of three point-to-point distances, that is, the distance between the sensor output value $P_{NEW}$ that is detected thereat and the first-point sensor output value $P_A$, the distance between the sensor output value $P_{NEW}$ that is detected thereat and the second-point sensor output value $P_B$, and the distance between the sensor output value $P_{NEW}$ that is detected thereat and the third-point sensor output value $P_C$ is not smaller than the predetermined distance value or not (ST 16). If it is judged that each of these three point-to-point distances is not smaller than the predetermined distance value, it is further judged whether a planed angle that is formed by the triangles 21 and 22 (i.e., an angle that is formed by the plane of one triangle and the plane of the other triangle) falls within a predetermined angular range of 90°±Δθ or not (ST 17). If the planed angle that is formed by the triangles 21 and 22 falls within the predetermined angular range of 90±Δθ, the detected sensor output value $P_{NEW}$ is set as $P_D$ (ST 18).

In such sensor-output data acquisition, four points that satisfy the conditions described above are determined out of random sensor outputs. Therefore, it is possible to perform calibration without requiring a user who manipulates an electronic compass to execute any specific operation for the calibration.

Actually, errors arise in the output of a magnetic sensor due to a noise that is generated by an electronic circuit and/or because of reasons related to accuracy in A/D conversion. In order to exclude errors for finding the center of the virtual sphere (i.e., reference point) accurately, it is preferable to acquire a plurality of sets of the above-mentioned at least four outputs and then find an average of a group of centers of the virtual sphere, where each center is found on the basis of the corresponding set of the above-mentioned at least four outputs. In such an averaging process, any low-density center value included in the group of centers of the virtual sphere, which is likely to contain a large error value, is excluded so as to find an average value with the use of high-density center values only.

When sensor-output data is acquired so as to determine the above-mentioned at least four points for each of the plurality of sets, the following three conditions should be satisfied. That is, a first condition that should be taken into consideration is that each distance between the point of one output and the point of another output is not smaller than a predetermined point-to-point distance value. A second condition that should be taken into consideration is that the distance between the found center of the virtual sphere and each of the above-mentioned at least four outputs, more specifically, output points $P_A$, $P_B$, $P_C$, and $P_D$, is not larger than a predetermined center-to-point distance value. A third condition that should be taken into consideration is that a planed angle or each planed angle that is formed by the above-mentioned at least two triangles does not exceed a predetermined angle tolerance (Δθ), the center of which is 90°.

In the acquisition of sensor-output data for the determination of the above-mentioned at least four points for each of the plurality of sets, each of these four points in each set is taken as an independent plot point. Thus, these points are plotted while ensuring that no plot point is shared among the plurality of sets. This means that the number of points plotted equals to the number of sets of four outputs multiplied by four. A plurality of four-point data-acquisition buffers is provided for such sensor-output acquisition. A sensor output is stored in each buffer in accordance with the procedure explained above with reference to FIG. 3. In order to provide equal buffering opportunity to these buffers in rotation, the storing of a plot point is started at a certain buffer that is next to one at which plot-point storage was successfully carried out in the last attempt for storage.

Figure 5:
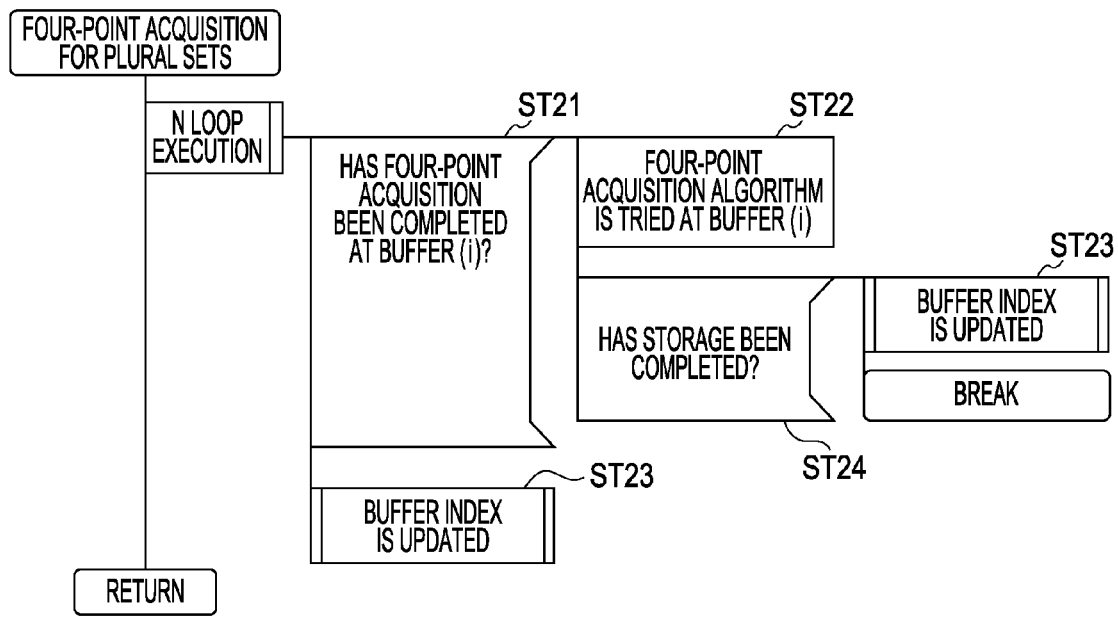
FIG. 5 is a flowchart that schematically illustrates the procedure of sensor-output data acquisition, and the storage thereof, for four points of N sets into buffers (0) to (N−1)
Figure 6:
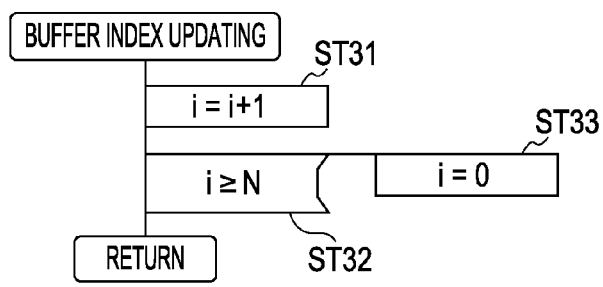
FIG. 6 is a flowchart that schematically illustrates the procedure of sensor-output data acquisition, and the storage thereof, for four points of N sets into buffers (0) to (N−1)

Each of FIGS. 5 and 6 is a flowchart that schematically illustrates the procedure of sensor-output data acquisition, and the storage thereof, for four points of N sets into buffers (0) to (N−1). Note that a buffer index (i) has been initialized into zero prior to the start of this sensor-output data acquisition procedure.

As shown in FIG. 5, a judgment is made as to whether four-point acquisition has been completed at a buffer (i) or not (ST 21). If it is judged that four-point acquisition has already been completed at the buffer (i), the buffer index is updated (ST 23). If it is judged that four-point acquisition has not been completed yet thereat, the four-point acquisition is performed in accordance with the procedure explained above while referring to FIG. 3 (ST 22). Next, it is judged whether the storing of sensor output obtained through the four-point acquisition into the buffer has been completed or not (ST 24). If it is judged that the storing of sensor output obtained through the four-point acquisition into the buffer has already been completed, the buffer index is updated (ST 23). A series of operations described above is repeated N times.

The updating of the buffer index is performed as follows. As shown in FIG. 6, the buffer number (i) is incremented by one (ST 31). Then, a judgment is made as to whether the number incremented by one is not smaller than N or not (ST 32). If it is judged that the number incremented by one is not smaller than N, the buffer number (i) is initialized (into zero) (ST 33).

Figure 7:
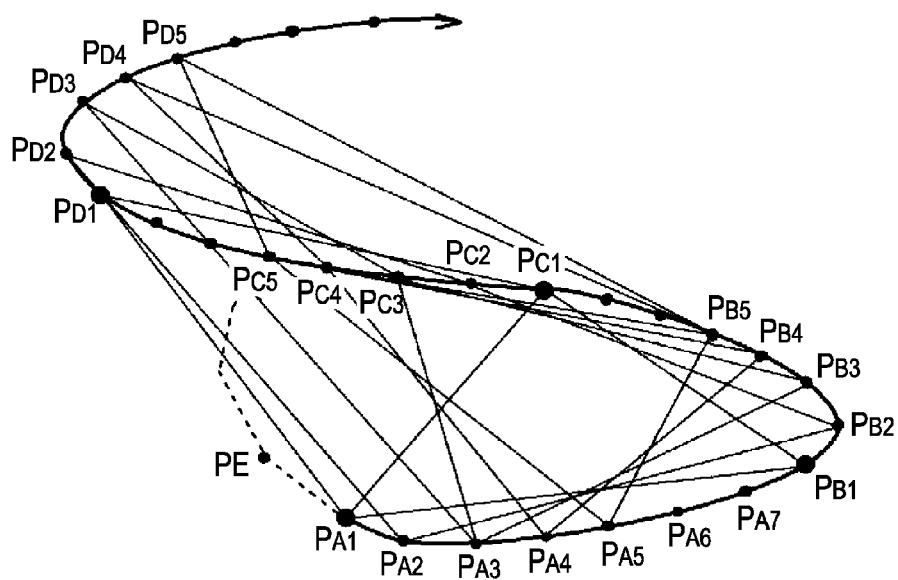
FIG. 7 is a schematic diagram that illustrates the concept of sensor-output data acquisition performed so as to determine four points for each of a plurality of sets, the procedure of which is shown in FIGS. 5 and 6.

FIG. 7 is a schematic diagram that illustrates the concept of sensor-output data acquisition performed so as to determine four points for each of a plurality of sets, the procedure of which is shown in FIGS. 5 and 6. FIG. 8 is a diagram that schematically illustrates the storage status of buffers in the process of four-point acquisition for the plurality of sets.

An explanation is given herein under assumptions that, for example, sensor output has a trajectory shown in FIG. 7 and that four points are determined for each of the plurality of sets among a large number of plot points. Herein, it is assumed that sensor-output data is acquired for five sets each of which is made up of four points. As a first step, a first plot point is unconditionally determined and then stored in each of a plurality of four-point acquisition buffers provided in advance as shown in FIG. 8(a). That is, initial five plot points ($P_{A1}$, $P_{A2}$, $P_{A3}$, $P_{A4}$, and $P_{A5}$) are stored each as a first point, that is, the first one of four points, into these buffers, respectively.

When it is attempted to store the next-acquired plot point ($P_{A6}$) into a buffer, a buffer search is performed so as to find a buffer in which the plot point ($P_{A6}$) can/should be stored. The search starts at a certain buffer that is next to one in which the last plot point has been stored. Specifically, in this example, the last plot point ($P_{A5}$) has been stored in a fifth buffer (buffer 5). Thus, such an attempt for the storing of the next-acquired plot point ($P_{A6}$) starts at a first buffer (buffer 1). Since the distance between the next plot point ($P_{A6}$) and each of the "first" plot points ($P_{A1}$, $P_{A2}$, $P_{A3}$, $P_{A4}$, and $P_{A5}$) stored in the respective buffers is short, the aforementioned condition is not satisfied. For this reason, the next plot point ($P_{A6}$) is discarded. For the same reason as above, a seventh plot point $P_{A7}$ is also discarded.

The distance between an eighth plot point ($P_{B1}$) that is acquired thereafter and the first plot point $P_{A1}$ stored in the first buffer is not smaller than a predetermined point-to-point distance value. Therefore, as shown in FIG. 8(b), the plot point $P_{B1}$ is stored as a second point, that is, the second one of four points, into the first buffer. In a similar manner, each of plot points $P_{B2}$-$P_{B5}$ is sequentially acquired and stored as the second point in the corresponding buffer where the above-mentioned distance condition is satisfied as shown in FIG. 8(c); and thereafter, each of plot points $P_{C1}$-$P_{C5}$ is sequentially acquired and stored as a third point, that is, the third one of four points, in the corresponding buffer where the above-mentioned distance condition is satisfied as shown therein. As for a fourth point to be acquired and stored in each buffer, that is, the fourth one of four points, in addition to a judgment made on the distance condition described above, another judgment is made as to whether a planed angle that is formed by two triangles satisfies a predetermined angular condition or not. If it is judged that both of these conditions are met, each acquired plot point is stored as shown in FIG. 8(d).

Note that the storing of plot points (i.e., sensor outputs) into each of a plurality of buffers (in this example, buffers 1-5) is not performed one by one after the completion of the storing of all plot points for the preceding buffer. That is, unlike such a one-by-one storage scheme according to which the storing of plot points into a certain buffer is started only after the completion of the storing of a set of all plot points (herein, four plot points) into the preceding buffer, the storing of plot points into the plurality of buffers is performed in a concurrent manner and on a "first-met-first-stored" basis. That is, each plot point for which the aforementioned judgment conditions are met is stored into the corresponding condition-met buffer even before the completion of the storing of a set of all plot points into the preceding buffer. In other words, as shown in FIGS. 8(c) and 8(d), a plot point is stored into a certain buffer while there still remain open storage areas in other buffers. As described above, since a judgment is made sequentially for each buffer as to whether the aforementioned judgment conditions are satisfied or not for each acquired plot point so as to store each condition-met plot point into the corresponding condition-met buffer on the first-met-first-stored basis, it is possible to acquire a plurality of sets of plot points in a smaller number of times of acquisition operations in comparison with a case where the storing of plot points into the next buffer is started only after the completion of the storing of a set of all four plot points satisfying the conditions into the current buffer. Thus, it is possible to complete calibration in a shorter time period while a user does not notice the execution thereof. The controlling unit 12 controls such storing of plot points into a plurality of buffers.

Although it is explained in the foregoing description of the present embodiment of the invention that the first, second, third, and fourth points are stored in a sequential manner with regularity into the plurality of buffers, the plot-point occupancy rate may vary from one buffer to another without such sequential regularity because each buffer stores plot points on the basis of conditions for an individual distance judgment and an individual planed-angle judgment that are unique to the buffer. For example, in a case where a user does not perform any special manipulation for calibration such as the manual rotation of a user device, sensor output might have a trajectory shown by a broken curved line in FIG. 7. Even in such a case, storage conditions are met for the fifth buffer at a point PE although they are not satisfied for the first buffer thereat. As described above, since a judgment is made sequentially for each buffer as to whether the aforementioned judgment conditions are satisfied or not for each acquired plot point so as to store each condition-met plot point into the corresponding condition-met buffer on the first-met-first-stored basis, it is possible to perform data acquisition efficiently even in a case where a sensor-output trajectory is drawn in a small area.

Then, a group of centers of the virtual sphere each of which is calculated on the basis of the corresponding one of the plural sets of four points acquired as explained above are subjected to averaging processing. As a result thereof, a true center of the virtual sphere, which is a solution to be found herein, is calculated. In such an averaging process, any low-density center value included in the group of centers of the virtual sphere is excluded so as to find an average value with the use of high-density center values only. For example, if five centers of the virtual sphere ($C_1$-$C_5$) are calculated, as shown in FIG. 9, low-density center values $C_4$ and $C_5$ included in the group of centers of the virtual sphere, each of which is likely to contain a large noise, are excluded so as to find an average value with the use of high-density center values ($C_1$-$C_3$) only. With such exclusion of relatively noise-affected center values in the averaging process, it is possible to calculate the true center of the virtual sphere only on the basis of reliable sets of four-point outputs that are less affected by noise. Thus, it is possible to calculate the center of the virtual sphere with smaller noise effects and greater accuracy not only in comparison with a case where a plurality of centers of the virtual sphere are simply averaged but also in comparison with a case where the center thereof is calculated as a result of matrix operation performed directly on the basis of a large number of outputs.

The relative density level of each of the plurality of centers, that is, the level of closeness of each center to others, is found as follows. First, for each of the plurality of centers, the sum ($L_n$) of distances between its own position ($C_n$) and the positions of other centers is calculated. If a first center $C_1$ among five centers is taken as an example, the sum ($L_1$) of a distance between the first center $C_1$ and a second center $C_2$ ($C_1$-$C_2$), a distance between the first center $C_1$ and a third center $C_3$ ($C_1$-$C_3$), a distance between the first center $C_1$ and a fourth center $C_4$ ($C_1$-$C_4$), and a distance between the first center C1 and a fifth center $C_5$ ($C_1$-$C_5$), is calculated. After the calculation of the aggregate distance for each of the plurality of centers, the average of the aggregate distances is calculated ($L_{AVE}=L_1+L_2+L_3+L_4+L_5/5$). Then, if it is judged that the aggregate distance Ln is either smaller than the average of the aggregate distances $L_{AVE}$ or equal thereto, the judgment-target center is regarded as a high-density center of the virtual sphere.

Figure 10:
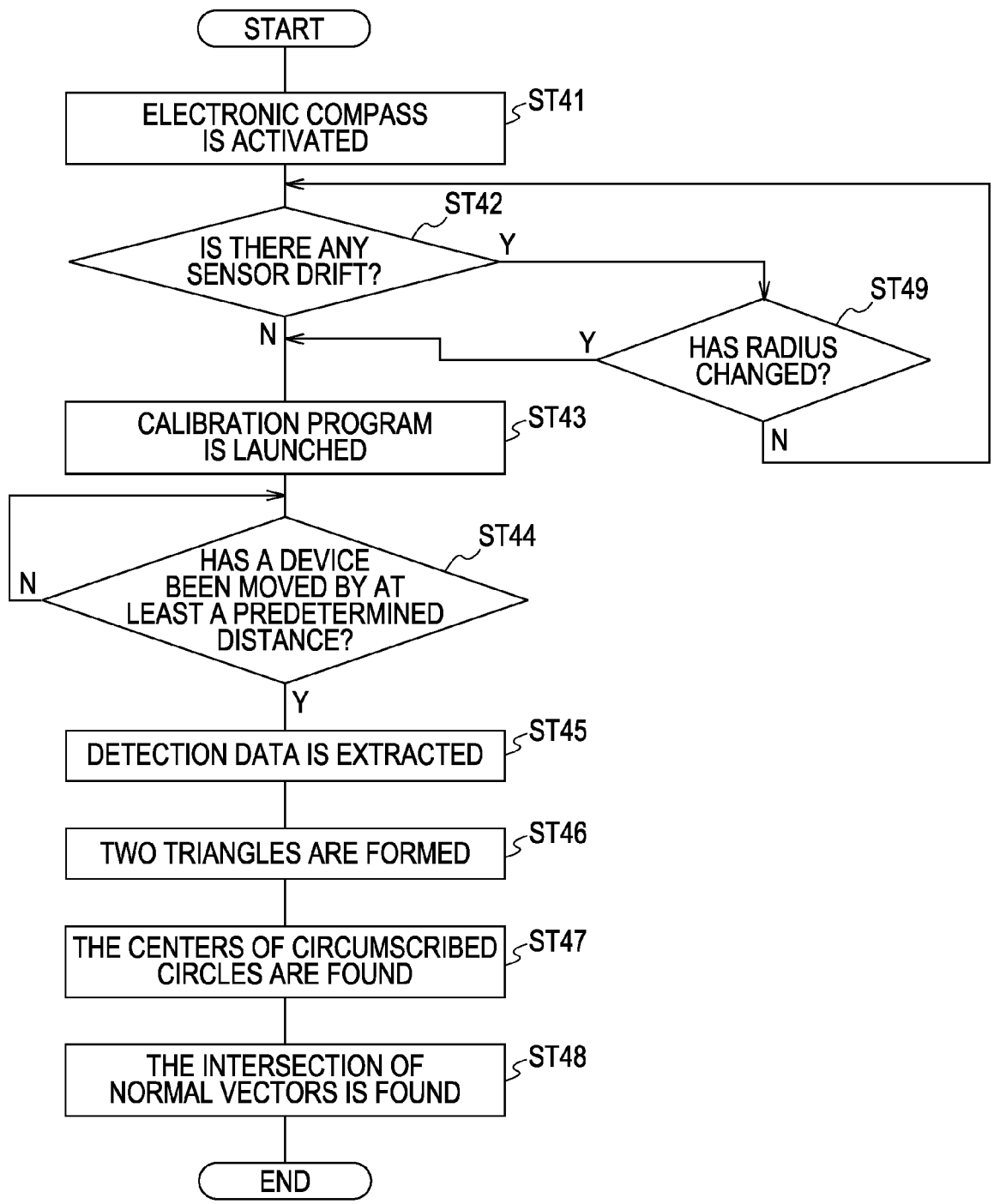
FIG. 10 is a flowchart that illustrates a calibration method that is implemented with the use of a calibration program according to an exemplary embodiment of the present invention.

Next, a method for calibration used by the above-explained electronic compass is explained below. FIG. 10 is a flowchart that illustrates a calibration method that is implemented with the use of a calibration program according to an exemplary embodiment of the present invention.

Upon the activation of the electronic compass 1 (ST 41), the electronic compass 1 makes a judgment as to whether any change in the ambient conditions thereof, that is, a sensor drift, has now occurred or not (ST 42). As the initial operation-start state of the electronic compass 1, there has not occurred any sensor drift. If no sensor drift has now occurred, the calibration program 122 of the controlling unit 12 is launched (ST 43).

Next, the magnetic sensor unit 111 of the compass module 11 acquires detection data (i.e., magnetic sensor outputs) so as to determine at least four points for calibration. In order for the magnetic sensor unit 111 of the compass module 11 to acquire detection data, it is necessary for a device on which the compass module 11 is mounted to be moved by a user by, at least, predetermined movement amount. Therefore, it is judged whether the device has been moved by at least a predetermined distance or not (ST 44). Such a judgment is performed as, for example, comparison against a threshold value. If it is judged that the device has been moved by at least the predetermined movement amount, four-point detection data is extracted (ST 45). Then, the calibration program 122 finds a reference point for the output of a magnetic sensor with the use of the extracted detection data.

That is, the aforementioned at least two triangles 21 and 22 are formed with the use of four magnetic-sensor outputs (ST 46). Next, the circumscribed circles 23 and 24 of the triangles 21 and 22 are found respectively (ST 47). Then, the intersection of normal vectors (25, 26) each of which passes through the center of the corresponding circumscribed circle (23, 24) is found so as to find the reference point (ST 48). Since the found reference point is the origin of a geomagnetic vector, the compass direction calculation program 121 finds a compass direction with the use of the found reference point.

Upon the occurrence of a sensor drift due to a change in the environmental conditions of the electronic compass 1 (ST 42), the electronic compass 1 makes a judgment as to whether the magnitude of a geomagnetic vector (i.e., the radius of the virtual sphere) that is found by the calibration program 122 has changed by at least predetermined change amount or not (ST 49). If it is judged that the magnitude of a geomagnetic vector has changed by at least predetermined change amount, the electronic compass 1 interprets that re-calibration is necessary and thus performs automatic re-calibration (ST 43-48).

As described above, an electronic compass according to the present embodiment of the invention makes it possible to find the reference point for the output of a magnetic sensor (i.e., the origin of a geomagnetic vector) and perform offset correction with a small amount of computation. In addition, it is possible to obtain detection data, which is used for finding the reference point, just by tilting a device on which a compass module is mounted by approximately ±30°. Therefore, it is possible to calibrate the output of a magnetic sensor and find a compass direction while a user does not notice the execution of calibration. Moreover, since re-calibration is performed automatically in response to the occurrence of a change in the ambient conditions of an electronic compass, it is possible to calculate a compass direction accurately while a user does not notice the execution of calibration.

The scope of the present invention is not limited to exemplary embodiments described above. The invention can be modified in various ways for implementation. For example, although a compass module and a controlling unit are configured as discrete units separated from each other in the exemplary configuration of an electronic compass described above, the scope of the present invention is not limited thereto. That is, a compass module and a controlling unit may be configured as a single integrated unit in the configuration of an electronic compass. The present invention can be modified as necessary for any particular use as long as such modification does not constitute any departure from the scope and spirit of the invention.

The invention claimed is:

1. A calibration method that is executed by a computer for finding a reference point for the output of a magnetic sensor, comprising:
    obtaining at least four outputs from the magnetic sensor wherein at least one output contains an error;
    forming at least two triangles from said at least four outputs of the magnetic sensor in a three-dimensional space, the at least two triangles including a first triangle and a second triangle;
    finding a first circle circumscribing the first triangle and a second circle circumscribing the second triangle, the first circle and the second circle each corresponding to a cut section of a virtual sphere;
    obtaining a first normal vector and a second normal vector passing through a center of the first circle and a center of the second circle, respectively;
    finding the reference point as an intersection of the first and second normal vectors, the reference point being the center of the virtual sphere; and
    calibrating the magnetic sensor using the reference point, wherein said finding the reference point includes:
        acquiring a plurality of sets of said at least four outputs, wherein each set defines the corresponding virtual sphere; and
        finding an average of a group of centers, each center being found on the basis of the corresponding set of said at least four outputs.

2. The calibration method according to claim 1, wherein said at least four outputs are obtained so as to satisfy following two conditions:
    (a) each distance between the point of one output and the point of another output is not smaller than a predetermined distance value; and
    (b) each planed angle formed by said at least two triangles does not exceed a predetermined angle tolerance ($\Delta\theta$), the center of which is 90°.

3. An electronic compass comprising:
    a compass module that is provided with a magnetic sensor; and
    a controlling section provided with a calibration program and performs the calibration method according to claim 2, so as to find the reference point for the output of the magnetic sensor, the controlling section being further provided with a compass direction calculation program and finding a compass direction with the use of the output of the magnetic sensor.

4. The calibration method according to claim 1, wherein said at least four outputs are obtained so as to satisfy following three conditions:
    (a) each distance between the point of one output and the point of another output is not smaller than a predetermined distance value;
    (b) the distance between the found center of the virtual sphere and each of said at least four outputs is not larger than a predetermined distance value; and
    (c) each planed angle that is formed by said at least two triangles does not exceed a predetermined angle tolerance ($\Delta\theta$), the center of which is 90°.

5. An electronic compass comprising:
    a compass module that is provided with a magnetic sensor; and
    a controlling section provided with a calibration program and performs the calibration method according to claim 1, so as to find the reference point for the output of the magnetic sensor, the controlling section being further provided with a compass direction calculation program and finding a compass direction with the use of the output of the magnetic sensor.

6. The electronic compass according to claim 5, wherein the controlling section is further provided with a plurality of buffers each of which can store said at least four outputs; and the controlling section judges whether it is possible to store the output of the magnetic sensor into the plurality of buffers or not on the basis of predetermined judgment conditions.

7. The electronic compass according to claim 5, wherein the controlling section automatically runs the calibration program in response to the occurrence of a change in the ambient conditions of the magnetic sensor.

8. A calibration method that is executed by a computer for finding a reference point for the output of a magnetic sensor, comprising:
    obtaining at least four outputs from the magnetic sensor wherein at least one output contains an error;
    forming at least two triangles from said at least four outputs of the magnetic sensor in a three-dimensional space;
    finding, for each of said at least two triangles, a circle circumscribed about the triangle, each circle corresponding to a cut section of a virtual sphere; and
    finding an intersection of normal vectors each of which passes through a center of the corresponding circumscribed circle so as to find the reference point, the reference point being the center of the virtual sphere; and
    calibrating the magnetic sensor using the reference point, wherein said finding the reference point includes:

acquiring a plurality of sets of said at least four outputs, wherein each set defines the corresponding virtual sphere; and finding an average of a group of centers, each center being found on the basis of the corresponding set of said at least four outputs, and wherein said at least four outputs are obtained so as to satisfy following two conditions: a first condition is that each distance between a point of one output and a point of another output is not smaller than a predetermined distance value; and a second condition is that a planed angle or each planed angle that is formed by said at least two triangles does not exceed a predetermined angle tolerance ($\Delta\theta$), the center of which is 90°.

9. An electronic compass comprising:

a compass module that is provided with a magnetic sensor; and a controlling section provided with a calibration program and performs the calibration method according to claim 8, so as to find the reference point for the output of the magnetic sensor, the controlling section being further provided with a compass direction calculation program and finding a compass direction with the use of the output of the magnetic sensor.

* * * * *